United States Patent
Boguslavskiy et al.

(10) Patent No.: US 8,021,487 B2
(45) Date of Patent: Sep. 20, 2011

(54) WAFER CARRIER WITH HUB

(75) Inventors: Vadim Boguslavskiy, Princeton, NJ (US); Alexander I. Gurary, Bridgewater, NJ (US)

(73) Assignee: Veeco Instruments Inc., Plainview, NY (US)

( * ) Notice: Subject to any disclaimer, the term of this patent is extended or adjusted under 35 U.S.C. 154(b) by 526 days.

(21) Appl. No.: 12/001,761

(22) Filed: Dec. 12, 2007

(65) Prior Publication Data
US 2009/0155028 A1  Jun. 18, 2009

(51) Int. Cl.
C23C 16/00 (2006.01)
C23F 1/00 (2006.01)
H01L 21/306 (2006.01)

(52) U.S. Cl. ........ 118/730; 118/728; 118/729; 118/732; 156/345.51; 156/345.54; 156/345.55

(58) Field of Classification Search .................. 118/728, 118/729, 730, 731, 732; 156/345.51, 345.52, 156/345.53, 345.54, 345.55
See application file for complete search history.

(56) References Cited

U.S. PATENT DOCUMENTS

| | | | |
|---|---|---|---|
| 4,108,107 A * | 8/1978 | Scheuermann | 118/730 |
| 5,713,979 A | 2/1998 | Nicholson et al. | |
| 5,788,777 A | 8/1998 | Burk, Jr. | |
| 5,837,631 A | 11/1998 | Elstner et al. | |
| 6,086,680 A | 7/2000 | Foster et al. | |
| 6,118,100 A | 9/2000 | Mailho et al. | |
| 6,685,774 B2 | 2/2004 | Boguslavskiy et al. | |
| 6,726,769 B2 | 4/2004 | Boguslavskiy et al. | |
| 6,740,167 B1 | 5/2004 | Rupp et al. | |
| 6,899,764 B2 * | 5/2005 | Frijlink | 118/719 |
| 2003/0047132 A1 | 3/2003 | Boguslavskiy et al. | |
| 2004/0003779 A1 * | 1/2004 | Jurgensen et al. | 118/723 I |
| 2005/0022746 A1 * | 2/2005 | Lampe et al. | 118/728 |
| 2005/0104083 A1 | 5/2005 | Bader et al. | |
| 2005/0126496 A1 * | 6/2005 | Boguslavskiy et al. | 118/728 |
| 2006/0065196 A1 | 3/2006 | Yokogawa | |
| 2006/0252243 A1 | 11/2006 | Kishimoto et al. | |
| 2007/0120145 A1 | 5/2007 | Asano et al. | |

FOREIGN PATENT DOCUMENTS

| | | |
|---|---|---|
| JP | 61-135113 | 6/1986 |
| JP | 10-195660 | 7/1998 |

OTHER PUBLICATIONS

International Search Report, PCT/US2008/013295, dated May 21, 2009.

* cited by examiner

*Primary Examiner* — Parviz Hassanzadeh
*Assistant Examiner* — Tiffany Nuckols
(74) *Attorney, Agent, or Firm* — Lerner, David, Littenberg, Krumholz & Mentlik, LLP

(57) ABSTRACT

A wafer carrier for a rotating disc CVD reactor includes a unitary plate of a ceramic such as silicon carbide defining wafer-holding features such as pockets on its upstream surface and also includes a hub removably mounted to the plate in a central region of the plate. The hub provides a secure connection to the spindle of the reactor without imposing concentrated stresses on the ceramic plate. The hub can be removed during cleaning of the plate.

24 Claims, 3 Drawing Sheets

WAFER CARRIER WITH HUB

BACKGROUND OF THE INVENTION

The present invention relates to chemical vapor deposition apparatus.

Certain materials such as compound semiconductors are formed by exposing a surface of a workpiece, most commonly a disc-like wafer, to gases at elevated temperatures so that the gases react and deposit the desired material on the surface of the workpiece. For example, numerous layers of III-V semiconductors such as gallium nitride, indium nitride, gallium arsenide, indium phosphide and gallium antimonide and the like can be deposited onto a substrate to form electronic devices such as diodes and transistors and optoelectronic devices such as light-emitting diodes and semiconductor lasers. II-VI semiconductors can be deposited by similar processes. The properties of the finished device are profoundly influenced by minor variations in properties of the various layers deposited during the process. Therefore, considerable effort has been devoted in the art development of reactors and processing methods which can achieve uniform deposition over a large wafer surface or over the surfaces of numerous smaller wafers held in the reactor.

One form of reactor which has been widely used in the industry is the rotating disc reactor. Such a reactor typically includes a disc-like wafer carrier. The wafer carrier has pockets or other features arranged to hold one or more wafers to be treated. The carrier, with the wafers thereon, is placed into a reaction chamber and held with the wafer-bearing surface of the carrier facing in an upstream direction. The carrier is rotated, typically at rotational velocities of several hundred revolutions per minute, about an axis extending in the upstream to downstream direction. Reactive gases are directed in the downstream direction towards the wafers on the carrier from an injector head positioned at the upstream and the reactor. The wafer carrier is maintained at a desired elevated temperature, most commonly about 350° C. to about 1600° C. during this process. The rotation of the wafer carrier helps to assure that all areas of the exposed wafers are exposed to substantially uniform conditions and that helps to assure uniform deposition of the desired semiconductor material. After the wafers on a particular wafer carrier have been treated, the wafer carrier is removed from the reaction chamber and replaced by a new wafer carrier bearing new wafers and the process is repeated with the new wafer carrier.

Many rotating disc reactor designs incorporate a spindle with a disc-like metallic element, referred to as a "susceptor" permanently mounted on the spindle. The wafer carrier to be treated is disposed on the susceptor and held by the susceptor during the treatment process. Heating elements such as electrical resistance elements disposed downstream of the susceptor heat the susceptor and the wafer carrier during the process. More recently, as disclosed in U.S. Pat. No. 6,685,774, the disclosure of which is incorporated by reference herein, "susceptorless" reactors have been developed. In a susceptorless reactor, the wafer carrier is mounted directly onto the spindle of the reactor when the wafer carrier is placed into the reactor chamber for treatment. The surface of the wafer carrier facing downstream is directly exposed to the heating elements. The susceptorless reactor design provides significantly improved heat transfer from the heating elements of the reactor to the wafer carrier and significantly improved uniformity of heat transfer to all areas of the wafer carrier.

A wafer carrier for a susceptorless reactor must incorporate features which allow the wafer carrier to mechanically engage the spindle when the wafer carrier is placed into the reaction chamber. Such engagement must be provided without damaging the spindle. Moreover, the wafer carrier must be formed from materials which retain substantial strength and rigidity at the elevated temperatures employed and which do not react with the gases employed in the process. Although satisfactory wafer carriers for susceptorless reactors can be formed from materials such as silicon carbide-coated ceramic materials, still further improvement would be desirable.

SUMMARY OF THE INVENTION

One aspect of the invention provides a wafer carrier for a CVD reactor. The wafer carrier desirably includes a plate of a non-metallic refractory material, preferably a ceramic material such as silicon carbide. The plate has oppositely-facing upstream and downstream surfaces, and has a central region and a peripheral region. The plate has wafer-holding features adapted to hold a plurality of wafers exposed at the upstream surface of the plate in the peripheral region. The wafer carrier according to this aspect of the invention desirably also includes a hub attached to the plate in the central region, the hub having a spindle connection adapted to engage a spindle of a CVD reactor so as to mechanically connect the plate with the spindle. The hub may be formed at least in part from one or more materials other than the material of the plate. For example, the hub may include metallic elements and may also include an insert formed from a relatively soft material such as graphite defining the spindle connection. In operation, the hub mechanically connects the plate to the spindle without imposing potentially damaging concentrated loads on the plate. Desirably, the hub is removably attached to the plate.

A further aspect of the invention provides a chemical vapor deposition reactor incorporating a wafer carrier as discussed above, together with additional elements such as a reaction chamber, a spindle mounted within the reaction chamber for rotation about an axis extending generally in the upstream to downstream direction, an injector head for introducing one or more reaction gases into the reaction chamber, and one or more heating elements surrounding the spindle. The spindle connection of the wafer carrier is adapted to mount the wafer carrier on the spindle with the upstream surface of the plate facing toward the injector head and with the downstream surface of the plate facing toward the one or more heating elements. Preferably, when the wafer carrier is mounted on the spindle, the downstream surface of the plate in the peripheral region of the plate directly confronts the heating elements. Stated another way, the hub preferably does not extend between the peripheral region of the plate downstream surface and the heating elements. Thus, the hub does not interfere with radiant heat transfer between the heating elements and the plate.

Yet another aspect of the invention provides methods of treating wafers. A method according to this aspect of the invention desirably includes the steps of processing a plurality of wafer carriers, each including a hub and a plate removably attached to the hub, by engaging the hub of each wafer carrier with a spindle of a processing apparatus and rotating the spindle and wafer carrier while treating wafers carried on the plate, and removing wafers from each wafer carrier after that wafer carrier has been processed. The treatment preferably includes a chemical vapor deposition process. These steps desirably are repeated using new wafers. The method according to this aspect of the invention most desirably includes the further step of renewing each wafer carrier by removing the hub from the plate, then cleaning the plate, and then reassembling the plate with the same or a different hub.

The step of cleaning the plate may include etching the plate. Because the hub is removed from the plate before cleaning, the steps used to clean the plate may include treatments which would attack the hub.

DETAILED DESCRIPTION

Figure 1:
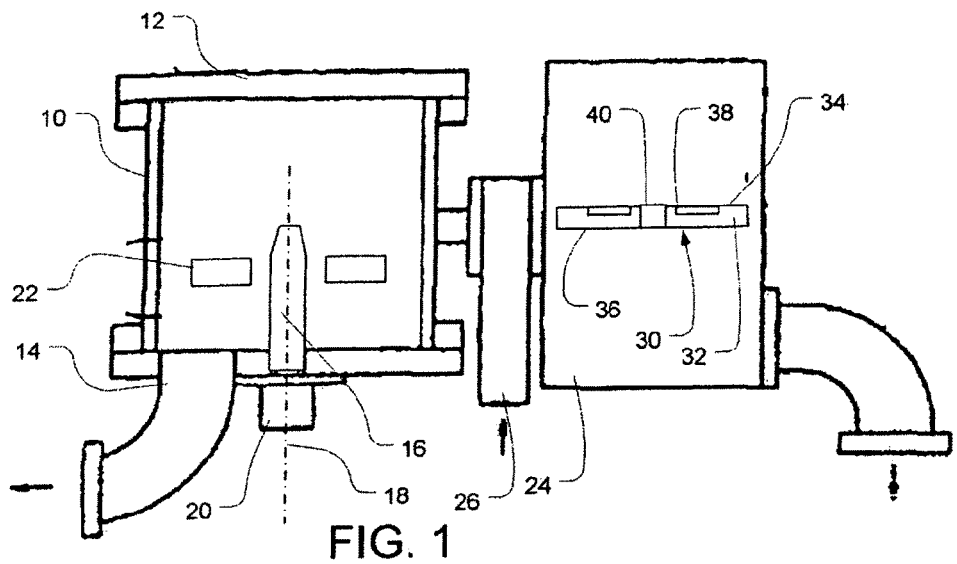
FIG. 1 is a diagrammatic view of a reactor and associated wafer carrier in accordance with one embodiment of the invention.

A susceptorless reactor system according to one embodiment of the invention incorporates a reaction chamber 10. Chamber 10 has a gas injector head 12 at its upstream end and an exhaust connection 14 open to the interior of the chamber adjacent its downstream end. Reaction chamber 10 is equipped with a spindle 16 having its axis 18 extending generally in the upstream to downstream direction of the chamber. Spindle 16 is connected to a motor drive 20 for rotating the spindle about axis 18. The spindle is equipped with a suitable vacuum seal (not shown). A heating device 22 is mounted within chamber 10 in a fixed position so that the heating device surrounds spindle 16 adjacent its upstream end. By way of example, heating device 22 may include one or more electrical resistance heaters, one or more elements suitable for receiving RF energy and converting the same to heat or essentially any other device capable of evolving heat without contaminating the interior of chamber 10.

The interior of chamber 10 is connected to the interior of a preload chamber 24 by a loading lock 26. Lock 26 is equipped with a gas-tight shutter which can be selectively opened to permit communication between chambers 10 and 24 and closed to block such communication. The preload chamber 24 is provided with an appropriate loading door (not shown) so that wafer carriers can be placed into the preload chamber and removed therefrom. Also, the preload chamber 24 is connected to an atmospheric control system (not shown) so that an atmosphere corresponding to the atmosphere within chamber 10 can be provided within chamber 24. Chambers 10 and 24 are provided with an appropriate robotic handling device (not shown) for moving wafer carriers between the chambers and for placing wafer carriers onto spindle 16 and removing the wafer carriers from the spindle.

The system further includes one or more wafer carriers 30. As discussed in greater detail below, each wafer carrier includes unitary plate or body 32 defining an upstream surface 34 and an oppositely facing downstream surface 36. The upstream surface 34 is provided with features such as pockets 38 arranged to hold wafers so that the surfaces of the wafers face generally upstream. Each wafer carrier also includes a hub 40 exposed adjacent the center of body 32, the hub 40 being adapted to mate with the upstream end of spindle 16. In the loading position depicted in FIG. 1, a wafer carrier 34 with wafers in pockets 38 is disposed within chamber 24. In the operative, deposition position depicted in FIG. 2, the same wafer carrier 30 is disposed within reaction chamber 10 and is engaged on spindle 16. While the wafer carrier is in the active or deposition position depicted in FIG. 2, the body 32 of the wafer carrier overlies heating elements 22. In this condition, the heating elements are operated to heat the wafer carrier to the desired elevated temperature. Spindle 16 is rotated so as to thereby rotate the wafer carrier and the wafers thereon about axis 18. Reactive gasses pass downstream from injector head 12 and pass over the upstream facing surface of the wafer carrier and over the surfaces of the wafers disposed in the pockets of the wafer carrier. The gasses react at the surfaces of the wafers, thereby forming the desired material on the surfaces of the wafers. Merely by way of example, in a deposition process for forming a III-V semiconductor, the reactive gasses may include first and second gasses. The first gas may include one or more organometallic compounds, most typically metal alkyls selected from the group consisting of gallium, indium and aluminum alkyls, in admixture with a carrier gas such as nitrogen or hydrogen. The second gas may include one or more hydrides of a group V element, such as ammonia or arsine, and may also include one or more carrier gasses. Following deposition, the wafer carrier with the finished wafers is returned to preload chamber 24 and a different wafer carrier with new wafers is placed onto the spindle 16. The features of the deposition apparatus apart from the wafer carrier and the related mating features of the spindle may be generally similar to those disclosed in the aforementioned U.S. Pat. No. 6,685,774, the disclosure of which is hereby incorporated by reference herein.

Figure 3:
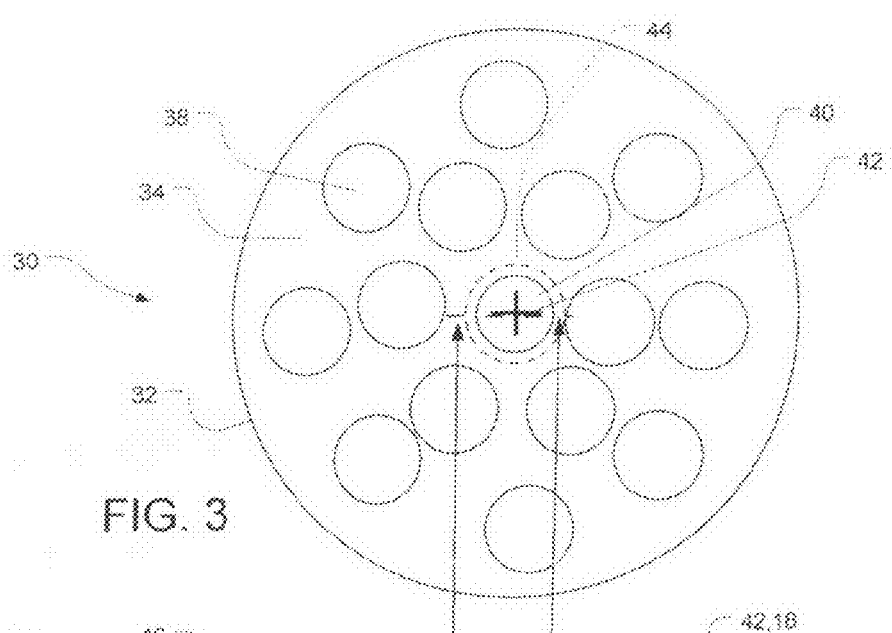
FIG. 3 is diagrammatic top plan view depicting the wafer carrier used in the system of FIGS. 1 and 2.
Figure 4:
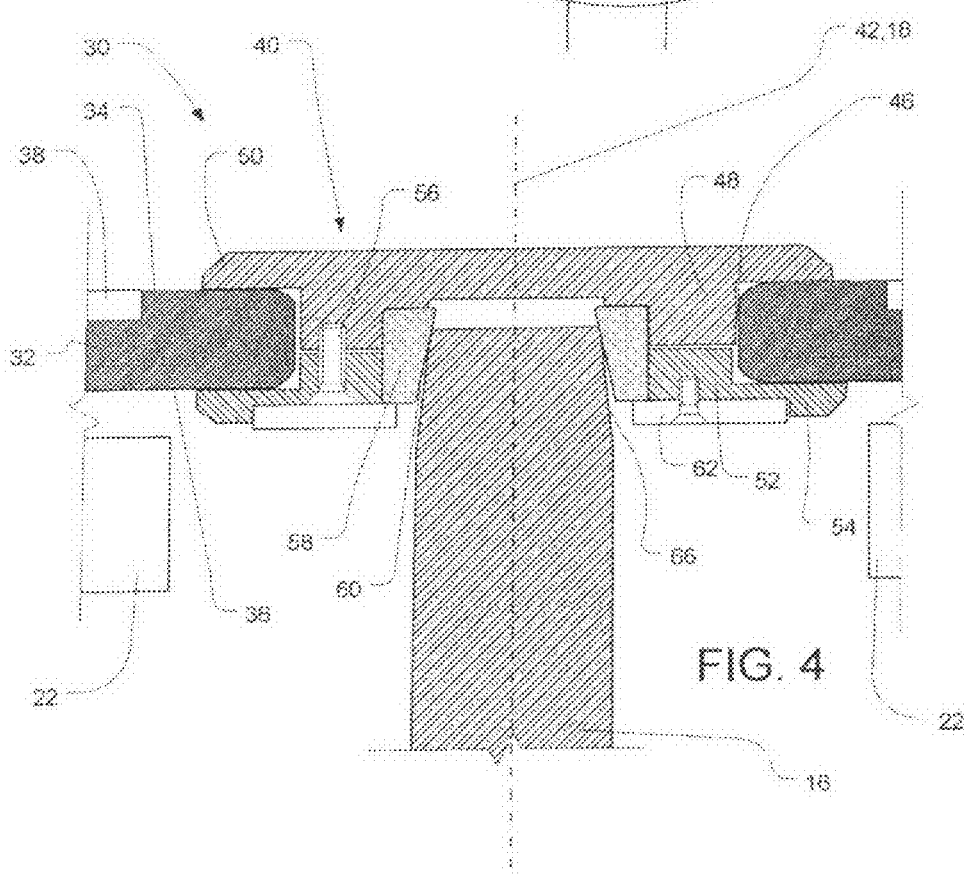
FIG. 4 is a fragmentary sectional view taken along line 4-4 in FIG. 3.

As best seen in FIGS. 3 and 4, wafer carrier 30 has a central axis 42 which is coincident with the axis 18 of the spindle when the wafer carrier is mounted on the spindle. Plate 32 is a plate of one or more refractory materials, preferably one or more non-metallic refractory materials. As used in this disclosure, the term "non-metallic" material includes compounds of metals with non-metals, such as oxides, nitrides and carbides of metals, and also includes carbon and other non-metallic elements and compounds thereof. Also, as used in this disclosure, a plate "of" one or more materials should be understood as referring to a plate in which the one or more materials constitute at least the majority of the thickness of the plate over at least the majority of the area of the plate, and in which the one or more materials contribute at least a substantial portion of structural strength of the plate. Thus, unless otherwise specified, a plate of one or more non-metallic materials may include minor layers or other minor features formed from other materials. The material of the plate desirably is resistant to the temperatures and chemical environment encountered in the wafer processing operation and in operations used to clean the wafer carrier. Although the material of the plate should have substantial structural strength, it may be a brittle material with high sensitivity to localized stresses. As explained below, the structure of the wafer carrier desirably protects the plate from high localized stresses imposed by the spindle in use. Non-metallic refractory materials selected from the group consisting of silicon carbide, boron nitride, boron carbide, aluminum nitride, alumina, sapphire, quartz, graphite, and combinations thereof are preferred. Most desirably, the plate is a unitary slab of a single non-metallic refractory material. Unitary plates formed from silicon carbide are particularly preferred. In some cases, the plate may include a coating. The coating material desirably is resistant to the temperatures and chemicals encountered in use and cleaning of the wafer carrier as, for example, a coating of a metal carbide, oxide or nitride such as titanium carbide or tantalum carbide. Such a coating is particularly desirable where plate is formed from graphite.

Although the upstream and downstream surfaces 34 and 36 are depicted as completely planar surfaces apart from the pockets 38 in upstream surface 34, this is not essential. The thickness of plate 32 can vary over a wide range. However, in one example, plate 32 has an outside diameter of about 300 mm and is about 8 mm thick.

Plate 32 has a central region 44 encompassing central axis 42 and a peripheral region surrounding the central region 44. Although the border of central region 44 is depicted in broken lines in FIG. 3 for illustrative purposes, there may not be a visible boundary between the central region and the peripheral region. The wafer engaging features or pockets 38 are disposed in the peripheral region of the plate 32. Plate 32 has a central bore 46 extending through the plate from upstream surface 34 to downstream surface 36 in the central region so that the central bore encompasses the axis 42.

Hub 40 most preferably is removably attached to the central region of plate 32. Hub 40 includes an upstream hub element 48 having a generally cylindrical portion received in central bore 46 of plate 32 and also having a flange 50 overlying a portion of the upstream surface 34 of the plate immediately surrounding the central bore. Hub 40 further includes a downstream hub element 52 having a generally cylindrical portion extending into central bore 46 and having a flange 54 which overlies a portion of the downstream surface 36 of plate 32 within the central region of the plate. Hub elements 48 and 52 have a slight clearance fit within central bore 46. For example, the outside diameters of the hub elements (apart from the flanges) may be about 25 microns (0.001 inches) or so smaller than the inside diameter of central bore 46. Hub elements 48 and 52 are held together and urged toward one another by fasteners such as screws 56, of which only one is visible in FIG. 4, spaced around central axis 42. Thus, flanges 50 and 54 are forcibly engaged with the upstream and downstream surfaces 34 and 36 of plate 32. The hub elements may be formed from materials other than the materials of the plate. Hub elements 50 and 52 desirably are formed from metals which can survive the temperatures to be encountered in service and which will not corrode or contaminate the interior of the reaction chamber during use. For example, the hub elements may be formed from metals selected from the group consisting of molybdenum, tungsten, and rhenium, combinations of these metals and alloys of these metals. In other embodiments, the hub elements may be formed the same materials as the plate.

Hub 40 further includes an insert 58 defining a tapered hole with an open end facing in the downstream direction (toward the bottom of the drawing in FIG. 4), the hole having an interior diameter which decreases progressively in the upstream direction. Insert 58 desirably is formed from a material which can withstand the temperatures attained during service, but which is somewhat softer than the materials used to form the hub elements 48 and 52. For example, insert 58 may be formed from graphite. Insert 58 is retained within hub elements 48 and 52 by an insert retainer plate 62 which in turn is fastened to the downstream hub element 52 by one or more screws.

Figure 2:
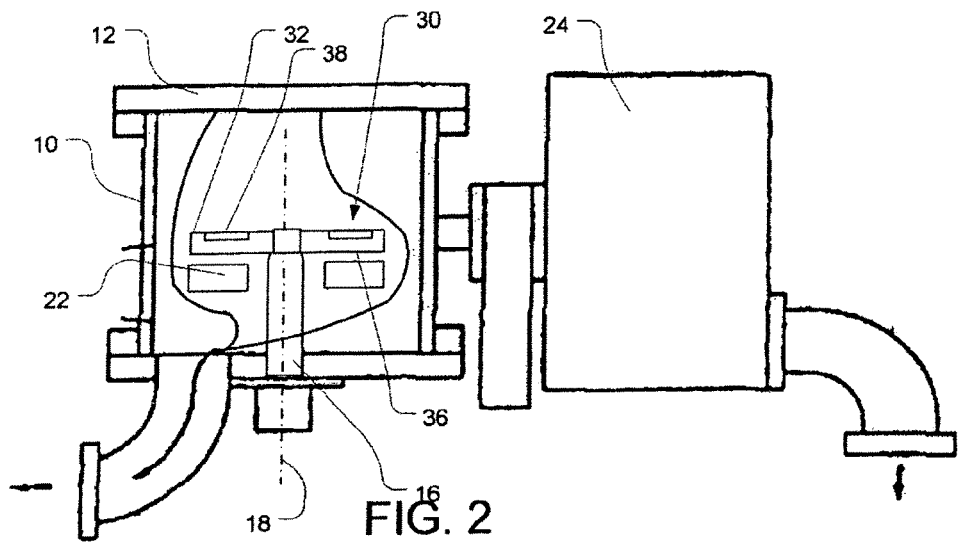
FIG. 2 is a view similar to FIG. 1 depicting the system in a different operating state.

In the operative, deposition position depicted in FIGS. 2 and 4, the wafer carrier 30 is mounted on spindle 16. Spindle 16 has a tapered end 66, and this tapered end is received within the tapered hole 60 of the insert. In the particular embodiment illustrated, the included angle of tapered end 66 is slightly less than the included angle of tapered hole 60 in the insert, so that the spindle engages insert 58 only at the extreme upstream end of the spindle and there is a slight clearance fit around tapered end 66 near the downstream or opened end of hole 60. In the operative position, the downstream surface 36 of plate 32 confronts the heating elements 22 of the reaction chamber. Because the hub 40, and particularly the downstream hub element 54 is disposed only within the central region of the plate 32, the downstream surface 36 of plate 32 within the peripheral region is not covered by the hub. Thus, as seen in FIG. 4, the downstream surface 36 plate in the peripheral region directly confronts the heating elements 22, with no solid structures intervening between the downstream surface 36 of the plate peripheral region and the heating elements 22. Thus, there is a direct path for radiant heat transfer from the heating elements to the peripheral region of the plate. This promotes efficient heat transfer between heating elements 22 and plate 32. Stated another way, the hub 40 does not extend between the heating elements and the downstream surface of the plate in the peripheral regions and does not interfere with heat transfer from the heating elements to the plate. Use of a hub tends to retard heat transfer from the plate to spindle 16. Thus, as best seen in FIG. 4, there are physical interfaces between the plate 32 and the hub elements 48 and 52, an additional interface between the hub elements and insert 58, and yet a further interface between the insert 58 and spindle 16. All of these interfaces have the desirable effect of reducing heat transfer from the plate to the spindle.

The use of a solid plate such as a solid plate of a non-metallic refractory material such as silicon carbide or other materials having high thermal conductivity provides significant advantages. The solid plate tends to promote temperature uniformity. A solid silicon carbide plate can be fabricated with a well-controlled surface morphology. Also, a solid silicon carbide plate is durable and can be subjected to cleaning processes such as wet etching to remove materials deposited on the plate during wafer processing. The hub may be detached from the plate prior to any such cleaning processes. Typically, the apparatus includes numerous wafer carriers, so that some wafer carriers are available for treating wafers while others are being cleaned. Depending on process conditions, the cleaning process can be performed after each use of the wafer carrier to treat a batch of wafers, or can be performed less frequently. Also, after cleaning, the plate may be reassembled with the same hub or with another similar hub to provide a renewed wafer carrier.

The hub provides a secure mounting for the plate on the spindle of the reaction chamber. Because the spindle does not directly engage the plate, the spindle does not tend to crack the plate during use. The relatively soft material of insert 58 assures that the spindle of the reaction chamber will not be damaged when the wafer carrier is engaged with the spindle. Although insert 58 may become worn with repeated use of the wafer carrier, the insert 58 can be readily removed and replaced.

Figure 5:
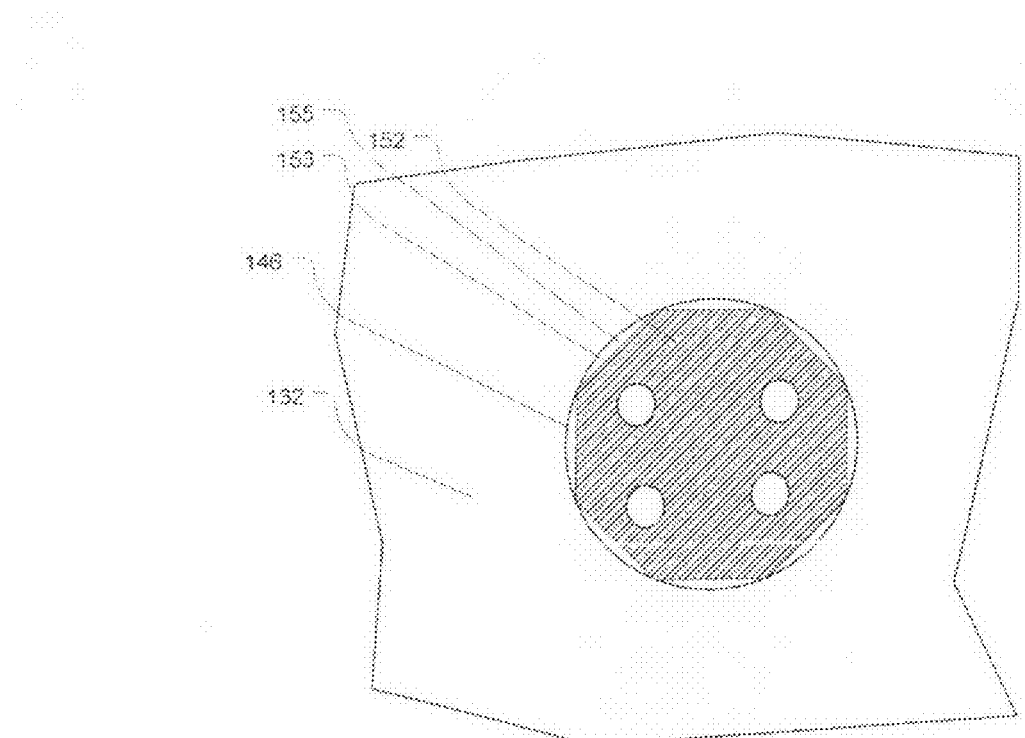
FIG. 5 is a fragmentary partially sectional view depicting portions of a wafer carrier in accordance with a further embodiment of the invention.

Numerous variations and combinations of the features discussed above may be employed. For example, as seen in FIG. 5, a hub element 152 which extends within the central bore 146 of the plate may be provided with a polygonal exterior surface 153 so as to provide relatively large clearances 155 between the hub element and the surface of central bore 146 except at the corners of the polygonal element. This arrangement further reduces conductive heat transfer from plate 132 to the hub element 152. Other shapes such as fluted or splined shapes may be used to provide a similar reduction in conductive heat transfer. Likewise, the surfaces of flanges 50 and 54 (FIG. 4) which are in contact with the surfaces of the plate may be ridged or fluted so as to reduce conductive heat transfer between the plate and the hub and thus reduce conductive heat transfer to the spindle.

Figure 6:
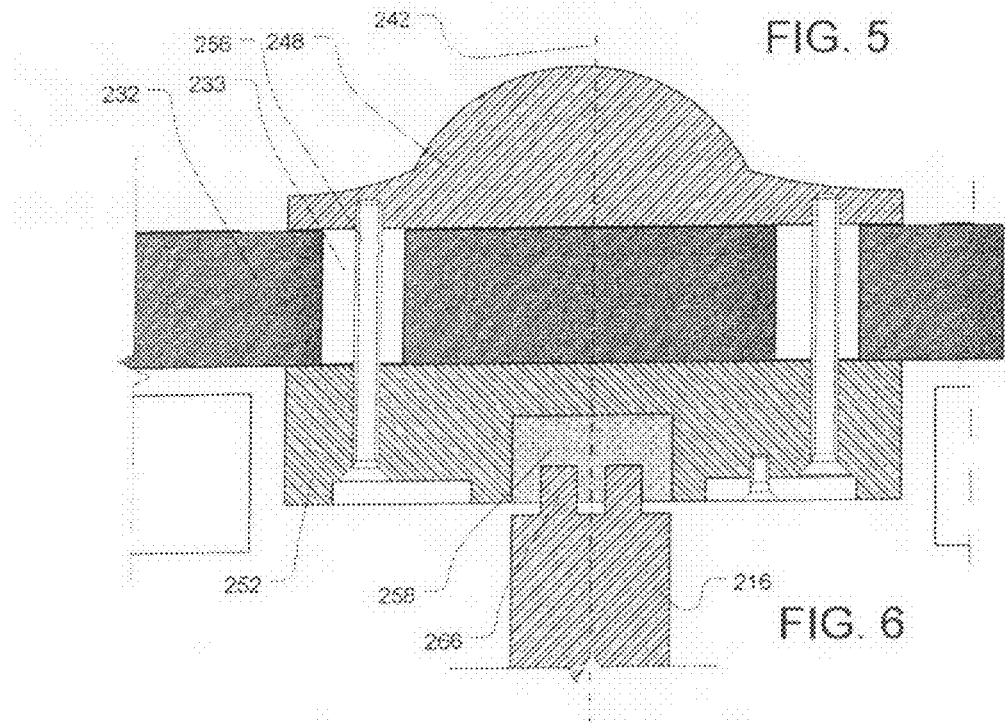
FIG. 6 is a view similar to FIG. 4 but depicting portions of a wafer carrier in accordance with yet another embodiment of the invention.

It is not essential to provide a central bore in the plate. Thus, as shown in FIG. 6, a plate 232 is provided with a set of small bores 233 extending between its upstream and downstream surfaces in the central region. An upstream hub element 248 and downstream hub element 252 are provided on the upstream and downstream of plate 232 and connected to one another by bolts 256 extending through holes 233. In this arrangement as well, the hub is removably attached to the plate. As used in this disclosure with reference to a plate and hub, the term "removably attached" means that the hub can be removed from the plate without damaging the plate and without damaging the major structural elements of the hub. Removable attachments other than bolted attachments can be used. For example, the removable attachment may include pins, wedges, clips or other mechanical fastening arrangements. Also, the connection between the hub and the spindle may not incorporate a tapered fitting as discussed above with reference to FIG. 4. Thus, in the embodiment of FIG. 6, the hub has an insert 258 with a set of recesses that engage mating pins 266 on the end of the spindle 106. Any other type of mechanical connection between the hub and the spindle can be employed.

In the embodiment discussed above with reference to FIGS. 1-4, the upstream hub element has a low, flat profile. However, as seen in FIG. 6, the upstream hub element 248 may have a domed shape so as to facilitate gas flow in the vicinity of the central axis 242. In yet another embodiment, one or both of the hub elements may directly engage the spindle without an intervening insert. As these and other variations and combinations of the features discussed above can be utilized without departing from the present invention, the foregoing description of the preferred embodiment should be taken by way of illustration rather than by way of limitation of the invention as defined by the claims.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A wafer carrier for a CVD reactor comprising:
(a) a plate of a non-metallic refractory material having oppositely-facing upstream and downstream surfaces, the plate having a central region and a peripheral region, the plate having wafer-holding features adapted to hold a plurality of wafers exposed at the upstream surface of the plate in the peripheral region; and
(b) a hub formed at least in part from one or more materials other than the non-metallic refractory material of the plate, the hub being formed separately from the plate, the hub being attached to the plate in the central region so that the plate surrounds the hub, the hub having a spindle connection adapted to releasably engage a spindle of a CVD reactor so as to mechanically connect the plate with the spindle when the carrier is installed in the reactor and to disengage from the spindle when the carrier is removed from the reactor, the hub being attached to the plate so that the wafer carrier, including the plate and hub, can be installed in the reactor and removed from the reactor as a unit,
wherein the hub includes an upstream hub element, at least a part of the upstream hub element overlying a portion of the upstream surface of the plate in the central region and a downstream hub element, at least a part of the downstream hub element overlying a portion of the downstream surface of the plate in the central region so that at least a part of the central region of the plate is disposed between the upstream and downstream hub elements, the hub further including a fastener urging the upstream and downstream hub elements towards one another so that the plate is clamped between the upstream and downstream hub elements.

2. A wafer carrier as claimed in claim 1 wherein the hub is removably attached to the plate.

3. A wafer carrier as claimed in claim 2 wherein the hub is formed at least in part from one or more metals.

4. A wafer carrier as claimed in claim 3 wherein the non-metallic refractory material is selected from the group consisting of silicon carbide, boron nitride, boron carbide, aluminum nitride, alumina, sapphire, quartz, graphite, and combinations thereof.

5. A wafer carrier as claimed in claim 3 wherein the non-metallic refractory material consists essentially of silicon carbide.

6. A wafer carrier as claimed in claim 3 wherein the plate includes a unitary slab of the non-metallic refractory material defining said central region and said peripheral region.

7. A wafer carrier as claimed in claim 1 wherein the non-metallic refractory material is selected from the group consisting of silicon carbide, boron nitride, boron carbide, aluminum nitride, alumina, sapphire, quartz, graphite, and combinations thereof.

8. A wafer carrier as claimed in claim 1 wherein the non-metallic refractory material consists essentially of silicon carbide.

9. A wafer carrier as claimed in claim 1 wherein the plate is a unitary slab formed entirely from the non-metallic refractory material.

10. A wafer carrier as claimed in claim 1 wherein the plate includes a coating covering the non-metallic refractory material at least on the upstream surface of the plate.

11. A wafer carrier as claimed in claim 10 wherein the coating is formed from a material selected from the group consisting of titanium carbide and tantalum carbide.

12. A wafer carrier as claimed in claim 1 wherein the hub is formed at least in part from one or more metals.

13. A wafer carrier as claimed in claim 12 wherein said one or more metals are selected from the group consisting of molybdenum, tungsten, rhenium, combination thereof and alloys thereof.

14. A wafer carrier as claimed in claim 12 wherein said hub includes an insert at least partially defining the spindle connection, the insert being formed from an insert material softer than said one or more metals.

15. A wafer carrier as claimed in claim 14 wherein the insert material consists essentially of graphite.

16. A wafer carrier as claimed in claim 1 wherein said connection includes a socket having a hole with an open end facing in the downstream direction.

17. A wafer carrier as claimed in claim 16 wherein said hole has a diameter which decreases progressively in the upstream direction.

18. A wafer carrier as claimed in claim 1 wherein the plate has a central bore extending between the upstream and downstream surfaces in the central region, and at least one of the hub elements projects into the central bore.

19. A wafer carrier as claimed in claim 18 wherein the central bore has a circular shape and a hub element projecting into the central bore has a non-circular shape.

20. A wafer carrier as claimed in claim 19 wherein the non-circular shape is polygonal.

21. A wafer carrier as claimed in claim 19 wherein the non-circular shape is splined or fluted.

22. A wafer carrier as claimed in claim 1 wherein the plate is substantially circular.

23. Chemical vapor deposition apparatus comprising a reaction chamber, a spindle mounted within the reaction chamber for rotation about an axis extending generally in an upstream to downstream direction, an injector head for introducing one or more reaction gases into the reaction chamber, and one or more heating elements surrounding the spindle, the apparatus further comprising a wafer carrier as claimed in claim 1, the connection of the wafer carrier being adapted to mount the wafer carrier on the spindle with the upstream surface of the plate facing toward the injector head and with the downstream surface of the plate facing toward the one or more heating elements.

24. Apparatus as claimed in claim 23 wherein, when the wafer carrier is mounted on the spindle, the downstream surface of the plate in the peripheral region of the plate directly confronts the heating elements.

\* \* \* \* \*